United States Patent
Ikeda et al.

(10) Patent No.: US 12,243,716 B2
(45) Date of Patent: Mar. 4, 2025

(54) PLASMA PROCESSING APPARATUS

(71) Applicant: Tokyo Electron Limited, Tokyo (JP)

(72) Inventors: Taro Ikeda, Yamanashi (JP); Toshifumi Kitahara, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 504 days.

(21) Appl. No.: 17/584,781

(22) Filed: Jan. 26, 2022

(65) Prior Publication Data

US 2022/0246399 A1    Aug. 4, 2022

(30) Foreign Application Priority Data

Feb. 4, 2021    (JP) .................................. 2021-016815

(51) Int. Cl.
    *H01J 37/32*    (2006.01)
(52) U.S. Cl.
    CPC .. *H01J 37/32082* (2013.01); *H01J 37/32229* (2013.01); *H01J 37/3244* (2013.01); *H01J 37/32577* (2013.01); *H01J 2237/332* (2013.01)
(58) Field of Classification Search
    None
    See application file for complete search history.

(56) References Cited

U.S. PATENT DOCUMENTS

| | | | | |
|---|---|---|---|---|
| 2012/0299671 A1* | 11/2012 | Ikeda | ........................ | H05H 1/46 333/248 |
| 2014/0262034 A1* | 9/2014 | Ishibashi | ............ | C23C 16/45563 118/723 AN |
| 2017/0253963 A1* | 9/2017 | Sabens | .............. | C23C 16/45563 |
| 2017/0350014 A1* | 12/2017 | Iwao | .................. | H01J 37/32229 |
| 2018/0294143 A1* | 10/2018 | Chua | .................. | H01J 37/32247 |
| 2019/0180984 A1* | 6/2019 | Ikeda | .................. | H01J 37/3244 |

FOREIGN PATENT DOCUMENTS

| | | |
|---|---|---|
| JP | 2020092024 A1 | 6/2020 |
| KR | 10-2002-0019006 A | 3/2002 |
| KR | 10-2009-0117806 A | 11/2009 |
| KR | 10-2018-0000681 A | 1/2018 |
| KR | 10-2019-0070283 A | 6/2019 |

* cited by examiner

*Primary Examiner* — Ram N Kackar
*Assistant Examiner* — Laureen Chan
(74) *Attorney, Agent, or Firm* — Armstrong Teasdale LLP

(57) ABSTRACT

A plasma processing apparatus includes: a coaxial tube that extends in a vertical direction and forms a portion of a radio frequency waveguide; a substrate support configured to support a substrate; an electrode including a gas flow path connected to a gas ejection port opened toward a space above the substrate support, wherein the electrode is provided above the substrate support and an inner conductor of the coaxial tube is connected to a center of the electrode; an enlarged diameter portion forming a part of the radio frequency waveguide together with the electrode and connected to an outer conductor of the coaxial tube; and dielectric tubes formed of a dielectric material, wherein each of the dielectric tubes is connected to the electrode and penetrates a space between the electrode and the enlarged diameter portion to supply a gas to the electrode, wherein the dielectric tubes is scatteredly provided.

10 Claims, 7 Drawing Sheets

PLASMA PROCESSING APPARATUS

CROSS-REFERENCE TO RELATED APPLICATION

This application is based upon and claims the benefit of priority from Japanese Patent Application No. 2021-016815, filed on Feb. 4, 2021, the entire contents of which are incorporated herein by reference.

TECHNICAL FIELD

The present disclosure relates to a plasma processing apparatus.

BACKGROUND

Patent Document 1 discloses a plasma processing apparatus including a shower plate having an upper electrode and an introduction part provided below the outside of a peripheral edge portion of the shower plate. The plasma processing apparatus further includes a waveguide part in order to supply radio frequency waves (VHF waves) to the introduction part. The waveguide part provides a cylindrical waveguide extending along a vertical direction. A lower end of the waveguide is connected to the introduction part. The waveguide is provided by a space between an outer peripheral surface of the upper electrode and an inner surface of a cylindrical member. In addition, at an upper end of the cylindrical member, an upper wall portion forming the waveguide together with a top surface of the upper electrode is located. In addition, the plasma processing apparatus is provided with a gas passage connecting a gas path in the upper wall portion and a gas path in the upper electrode to each other. The gas passage is constituted by two concentric insulating tubular bodies, and is formed of, for example, $SiO_2$ or $Al_2O_3$.

PRIOR ART DOCUMENT

[Patent Document]
Patent Document 1: Japanese Laid-Open Patent Publication No. 2020-92024

SUMMARY

An aspect of the present disclosure provides a plasma processing apparatus including: a coaxial tube that extends in a vertical direction and forms a portion of a radio frequency waveguide; a substrate support configured to support a substrate; an electrode including a gas flow path connected to a gas ejection port opened toward a space above the substrate support, wherein the electrode is provided above the substrate support and an inner conductor of the coaxial tube is connected to a center of the electrode; an enlarged diameter portion forming a part of the radio frequency waveguide together with the electrode and connected to an outer conductor of the coaxial tube; and dielectric tubes formed of a dielectric material, wherein each of the dielectric tubes is connected to the electrode and penetrates a space between the electrode and the enlarged diameter portion to supply a gas to the electrode, wherein the dielectric tubes is scatteredly provided

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
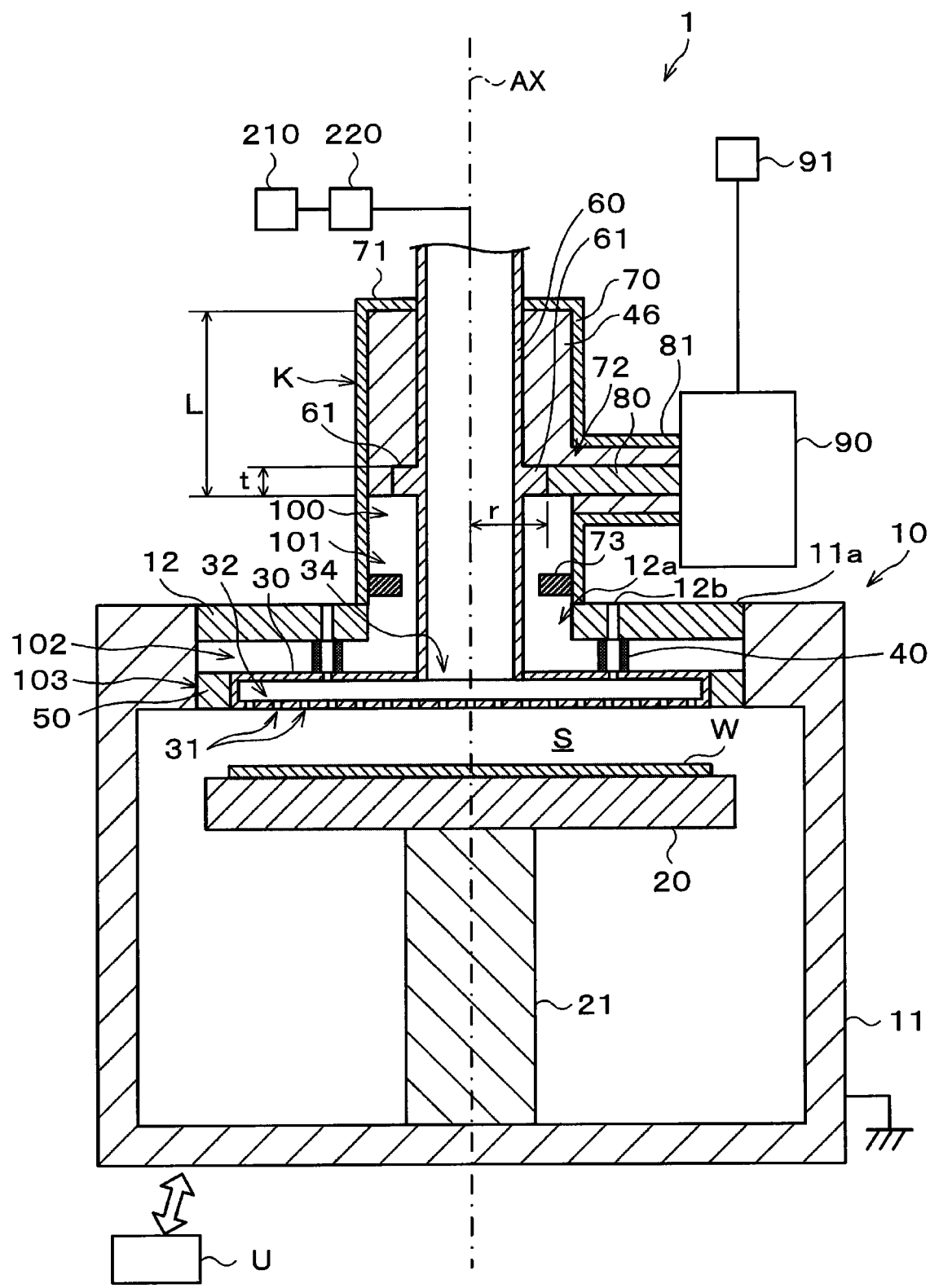
FIG. 1 is a vertical cross-sectional view schematically illustrating an outline of a configuration of a film forming apparatus as a plasma processing apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A semiconductor manufacturing process may include a plasma processing in which film formation or etching is performed on a substrate such as a semiconductor wafer (hereinafter, referred to as "wafer") by using plasma generated based on radio frequency waves.

A plasma processing apparatus that performs the plasma processing as described above may include a coaxial tube, a substrate support, a showerhead electrode, an enlarged diameter portion, and a dielectric tube. The coaxial tube is provided to extend in a vertical direction and forms a part of a radio frequency waveguide. The substrate support supports the substrate. The showerhead electrode is provided above the substrate support and has a gas flow path connected to a gas ejection port that is open toward a space above the substrate support. In addition, an inner conductor of the coaxial tube is connected to a center of the showerhead electrode. The enlarged diameter portion forms a part of the radio frequency waveguide together with the showerhead electrode and is connected to the coaxial tube. The dielectric tube is formed of a dielectric material such as $Al_2O_3$ (alumina). The dielectric tube is connected to the showerhead electrode so as to penetrate a space between the showerhead electrode and the enlarged diameter portion in the vertical direction. In addition, the dielectric tube supplies a gas from a gas source provided outside the enlarged diameter portion to the showerhead electrode via the enlarged diameter portion.

The plasma processing apparatus disclosed in Patent Document 1 is provided with one gas passage, which is formed of $SiO_2$, $Al_2O_3$, or the like and connects the gas path in the upper wall portion forming the waveguide together with the top surface of the upper electrode and the gas path inside the upper electrode, and the one gas passage is constituted by two concentric tubular bodies. That is, in the plasma processing apparatus disclosed in Patent Document 1, a gas introduction port and a gas supply port of the above-mentioned dielectric tube are formed in an annular shape centered at a center of the upper electrode in a plan view. When the dielectric tube having the shape disclosed in Patent Document 1 is used, in order to supply the gas uniformly to the space above the substrate support, it is necessary to increase a diameter of each tubular body forming the dielectric tube in a plan view. However, since radio frequency waves are absorbed by the dielectric tube, there is room for improvement in terms of electric power utilization efficiency when a large dielectric tube is used as described above.

Therefore, in a plasma processing apparatus that performs a plasma processing by using plasma generated based on radio frequency waves, when a dielectric tube for supplying a gas to an electrode is provided so as to penetrate a radio frequency waveguide, the technique according to the present disclosure suppresses a loss of electric power due to the dielectric tube.

Hereinafter, a configuration of a plasma processing apparatus according to the present embodiment will be described with reference to the drawings. In the present specification, elements having substantially the same functional configurations will be denoted by the same reference numerals, and redundant descriptions thereof will be omitted.

Film Forming Apparatus 1

Figure 2:
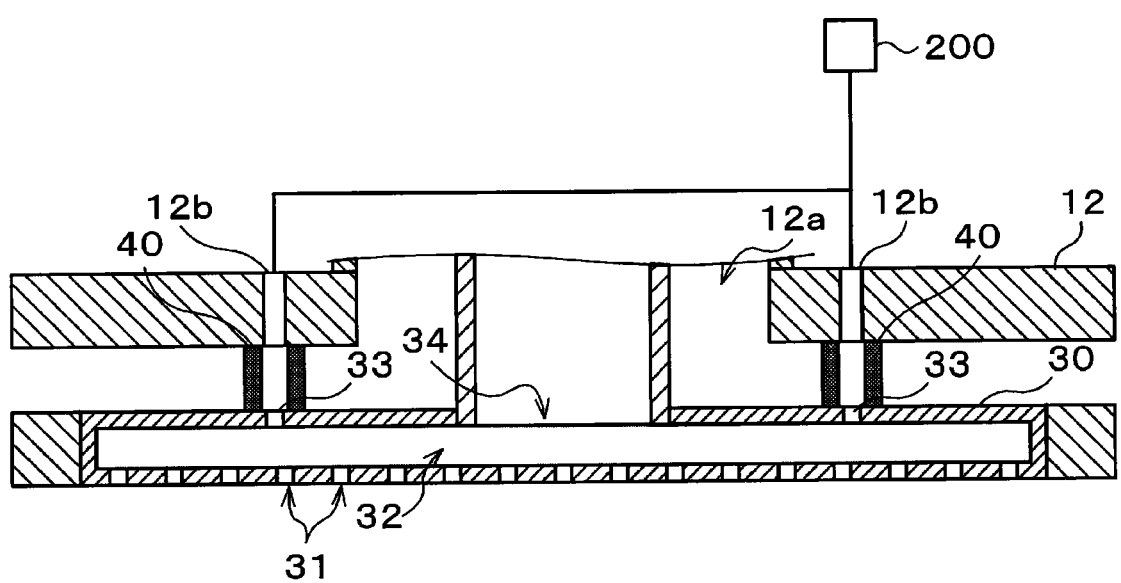
FIG. 2 is an enlarged view of a lid and a showerhead electrode.

FIG. 1 is a vertical cross-sectional view schematically illustrating an outline of a configuration of a film forming apparatus 1 as a plasma processing apparatus according to an embodiment. FIG. 2 is an enlarged view of a lid and a showerhead electrode, which will be described later.

The film forming apparatus 1 of FIG. 1 performs a film forming process, on a wafer W as a substrate, which is a plasma processing using plasma generated based on radio frequency waves. In the present specification, radio frequency waves are radio frequency electromagnetic waves having a frequency lower than that of microwaves, and include very high frequency (VHF) waves of 30 MHz to 300 MHz.

The film forming apparatus 1 forms, for example, a SiN film on the wafer W.

The film forming apparatus 1 includes a processing container 10 in which a plasma processing space S is formed. The processing container 10 is provided such that a central axis AX thereof extends in a vertical direction. In the processing container 10, the plasma processing space S is formed between a stage 20 and a showerhead electrode 30, which will be described later, provided inside the processing container 10.

The processing container 10 has a container main body 11 and a lid 12. The container main body 11 and the lid 12 are formed of aluminum or the like and are electrically connected to a ground potential.

The container main body 11 is formed in a hollow shape having an opening 11a. Specifically, the container main body 11 is formed in a bottomed cylindrical shape having the opening 11a at a top portion thereof. A central axis of the container main body 11 and a side wall of the container main body 11 coincides with the central axis AX of the processing container 10. Although not illustrated, in order to depressurize an interior of the processing container 10, specifically, to depressurize the plasma processing space S, an exhaust device is connected to a bottom portion of the container main body 11 via an APC valve (not illustrated) or the like.

The lid 12 is formed in a disk shape having a through-hole 12a in a center thereof. The lid 12 is installed at an upper portion of the container main body 11 to cover a peripheral edge portion of the opening 11a of the container main body 11.

As illustrated in FIG. 2, the lid 12 has gas flow paths 12b at respective locations corresponding to gas introduction paths 33 to be described later. Each of the gas flow paths 12b is connected to a processing gas source 200 provided outside the processing container 10 and is used to supply a processing gas from the processing gas source 200 to the showerhead electrode 30 (which will be described later) in the processing container 10.

A central axis of the lid 12 and the through-hole 12a coincides with the central axis AX of the processing container 10.

As illustrated in FIG. 1, the stage 20 as a substrate support is provided below the plasma processing space S within the processing container 10. The stage 20 supports the wafer W horizontally placed on a top surface thereof.

The stage 20 is supported by, for example, a support 21 erected in a center of the bottom portion of the container main body 11. Although not illustrated, the stage 20 is provided with a heater for heating the wafer W. Instead of a heating mechanism such as a heater, a cooling mechanism having a coolant flow path through which a cooling coolant flows may be provided, or both the heating mechanism and the cooling mechanism may be provided. In addition, a lifter (not illustrated) is provided to be movable upward and downward with respect to the stage 20. The lifter is for delivering the wafer W between the stage 20 and a wafer transfer device (not illustrated) inserted into the processing container 10 from the outside of the processing container 10.

The showerhead electrode 30 is provided above the plasma processing space S in the processing container 10 at a location facing the stage 20.

The showerhead electrode 30 is formed of, for example, a conductive material, specifically, a metallic material such as aluminum, and has a disk shape.

A plurality of gas ejection ports 31 opened toward the plasma processing space S is provided at a lower portion of the showerhead electrode 30, that is, a portion on a side of the plasma processing space S. Inside the showerhead electrode 30, a gas diffusion chamber 32 is provided as a gas passage connected to the gas ejection ports 31. The gas diffusion chamber 32 is formed in, for example, a substantially disk-like shape. As illustrated in FIG. 2, the plurality of gas introduction paths 33 is provided on a peripheral edge portion of an upper portion of the showerhead electrode 30. One end of each gas introduction path 33 is connected to the gas diffusion chamber 32, and the other end thereof is connected to one end of each of different dielectric tubes 40. The other end of each dielectric tube 40 is connected to a corresponding one of the gas flow paths 12b in the lid 12.

The processing gas from the processing gas source 200 provided outside the processing container 10 is supplied to the showerhead electrode 30 via the gas flow paths 12b in the lid 12 and the dielectric tubes 40, that is, is supplied to the gas diffusion chamber 32 via the gas flow paths 12b, the dielectric tubes 40, and the gas introduction paths 33, and is ejected to the plasma processing space S via the gas ejection ports 31. The processing gas supplied from the processing gas source 200 includes, for example, an excitation gas such as argon gas, a silane gas and nitrogen gas for forming a SiN film, and the like.

Details of the dielectric tubes 40 will be described later.

As illustrated in FIG. 1, the showerhead electrode 30 is supported on the processing container 10 via a dielectric window 50 formed of a dielectric material such as alumina.

In addition, an upper space and a lower space in the processing container 10 are separated by the showerhead electrode 30 and the dielectric window 50. Therefore, when the interior of the processing container 10 is depressurized by the above-mentioned exhaust device, the space above the dielectric window 50 is maintained in an atmospheric pressure state.

The dielectric window 50 is formed in an annular shape in a plan view and is provided to cover an outer peripheral surface of the showerhead electrode 30. The dielectric window 50 introduces radio frequency waves, which has been propagated through a waveguide 100 (which will be described later), from an outer periphery of the showerhead electrode 30 into the plasma processing space S.

A central axis of the showerhead electrode 30 and the dielectric window 50 coincides with the central axis AX of the processing container 10.

A gas introduction path 34 is provided in an upper center of the showerhead electrode 30. One end of the gas introduction path 34 is connected to the gas diffusion chamber 32, and the other end thereof is opened to a gas supply path inside a gas supply pipe 60.

The gas supply pipe 60 is formed of a metallic material such as aluminum in a cylindrical shape, and a lower end of the gas supply pipe 60 is connected to a center of a top surface of the showerhead electrode 30. The gas supply pipe 60 is provided to extend in the vertical direction and to penetrate the through-hole 12a in the lid 12.

A central axis of the gas supply pipe 60 coincides with the central axis AX of the processing container 10.

A cleaning gas supplied from a gas source 210 and plasmarized by a remote plasma source 220 is introduced into the gas supply pipe 60. The plasmarized cleaning gas introduced into the gas supply pipe 60 is supplied to the plasma processing space S via the gas introduction path 34, the gas diffusion chamber 32, and the gas ejection ports 31.

An inner diameter of the gas supply pipe 60 is set to be large, for example, to 30 mm or more, in order to suppress active species contained in the plasmarized cleaning gas from being deactivated by colliding with the gas supply pipe 60.

The gas supply pipe 60 has a flange 61. The flange 61 is provided, for example, at a center of the gas supply pipe 60 in the vertical direction. The flange 61 is formed in an annular shape in a plan view and is provided to protrude outward in a radial direction from an outer peripheral surface of the gas supply pipe 60. A diameter of a portion of the gas supply pipe 60 other than the flange 61 is, for example, 40 mm.

Above the processing container 10, a cover conductor 70 is provided to cover an upper portion of the gas supply pipe 60 protruding from the through-hole 12a of the lid 12. The cover conductor 70 is formed of a metallic material such as aluminum in a cylindrical shape, and a lower end of the cover conductor 70 is connected to a top surface of the lid 12. An inner diameter of the cover conductor 70 is substantially the same as, for example, a diameter of the through-hole 12a in the lid 12. A central axis of the cover conductor 70 coincides with the central axis AX of the processing container 10 and coincides with the central axis of the gas supply pipe 60.

The cover conductor 70 has an annular lid 71 in a plan view at an upper end thereof. By the lid 71, a space between an inner peripheral surface of the cover conductor 70 and the gas supply pipe 60 is in a closed state.

At a side portion of the cover conductor 70, a hole 72 is provided at a height position of the flange 61 of the gas supply pipe 60. With respect to the hole 72, a power feeding rod 80 is provided so as to extend in a horizontal direction and penetrate the hole 72. One end of the power feeding rod 80 is connected to a lateral end (specifically, an end on a side of the hole 72) of the flange 61 of the gas supply pipe 60. The other end of the power feeding rod 80 is connected to a power supply 91 via a matcher 90. The matcher 90 matches a load impedance of the power supply 91 with an internal impedance of the power supply 91. The power supply 91 outputs radio frequency (e.g., VHF band) power.

By supplying the radio frequency power from the power supply 91 to the power feeding rod 80, radio frequency waves are supplied to the space between the inner peripheral surface of the cover conductor 70 and the gas supply pipe 60.

An upper portion of the cover conductor 70 and an upper portion of the gas supply pipe 60 form a resonator K. Specifically, a portion of the cover conductor 70 above the flange 61 and a portion of the gas supply pipe 60 above the flange 61 form the resonator K. The radio frequency waves introduced into the resonator K are generated by supplying the radio frequency power to the power feeding rod 80 connected to the lateral end of the flange 61. That is, the radio frequency waves are introduced into the resonator K from a lateral side (in the horizontal direction).

For example, the entire internal space 46 of the resonator K (specifically, a region between a bottom surface of the flange 61 and a bottom surface of the lid 71 in the space between the gas supply pipe 60 and the cover conductor 70) is filled with polytetrafluoroethylene (PTFE).

In order to ensure that only desired radio frequency waves exists inside the resonator K, a radius r of an outer diameter of the flange 61, a thickness t of the flange 61, and a distance L between the bottom surface of the flange 61 and the bottom surface of the lid 71 of the cover conductor 70 satisfies, for example, the following equations, where $\lambda_g$ is an effective wavelength of electromagnetic waves.

$$\lambda_g/(4\times\pi)-\lambda_g/(30\times\pi)\leq r\leq\lambda_g/(4\times\pi) \qquad \text{Equation (1)}$$

$$18\text{ mm}\leq t\leq 40\text{ mm} \qquad \text{Equation (2)}$$

$$\lambda_g/6\leq L\leq\lambda_g/5 \qquad \text{Equation (3)}$$

When a frequency of the radio frequency waves is 220 MHz and the entire internal space of the resonator K is filled with PTFE, Equations (1) and (3) are expressed by Equations (1a) and (3a) described below.

$$67\text{ mm}\leq r\leq 73\text{ mm} \qquad \text{Equation (1a)}$$

$$158\text{ mm}\leq L\leq 183\text{ mm} \qquad \text{Equation (3a)}$$

In addition, a cover conductor 81 continuous from the cover conductor 70 is provided to cover the outer periphery of the power feeding rod 80. Like the cover conductor 70, the cover conductor 81 is formed of a metallic material such as aluminum in a cylindrical shape. A central axis of the cover conductor 81 coincides with a central axis of the power feeding rod 80.

The film forming apparatus 1 further includes the radio frequency waveguide (which may be simply referred to as a "waveguide") 100. The waveguide 100 propagates, to the plasma processing space S, the radio frequency waves generated by supplying the radio frequency power from the power supply 91 to the power feeding rod 80. More specifically, the waveguide 100 propagates the radio frequency waves resonated by the resonator K to the plasma processing space S. The waveguide 100 includes first to third waveguides 101 to 103.

The first waveguide 101 is formed by a coaxial tube provided to extend in the vertical direction. Specifically, an inner conductor of the coaxial tube is a portion of the gas supply pipe 60 below the flange 61. An outer conductor of the coaxial tube is specifically a wall forming a portion of the cover conductor 70 below the flange 61 and the through-hole 12a of the lid 12. The first waveguide 101 propagates the radio frequency waves downward along the central axis AX of the processing container 10 that coincides with an axial direction of the coaxial tube.

The cover conductor 70 forming the first waveguide 101 is provided with a protrusion 73 that protrudes inward from an inner peripheral surface of the cover conductor 70 and has an annular shape in a plan view. Like the cover conductor 70, the protrusion 73 is formed of a metallic material such as aluminum. The protrusion 73 is provided, for example, in a vicinity of the lid 12.

The second waveguide 102 is continuous from the first waveguide 101 and is defined by the bottom surface of the lid 12 and the top surface of the showerhead electrode 30 as the enlarged diameter portion. The second waveguide 102 propagates the radio frequency waves outward along the radial direction in a plan view. The dielectric tubes 40 are located in the second waveguide 102.

For example, a portion of the second waveguide 102 may be filled with a dielectric material (quartz or the like) other than air. More specifically, a portion of the second waveguide 102 outside the dielectric tubes 40 may be filled with quartz or the like. In addition, the entire second waveguide 102 may be filled with quartz or the like except for portions where the dielectric tubes 40 are disposed.

The third waveguide 103 is continuous from the second waveguide 102 and is defined by the outer peripheral surface of the showerhead electrode 30 and the inner peripheral surface of the side wall of the container main body 11. The third waveguide 103 is provided with the dielectric window 50. The third waveguide 103 propagates the radio frequency waves downward along the outer peripheral surface of the showerhead electrode 30 and introduces the radio frequency waves from the dielectric window 50 into the plasma processing space S.

Each of the first to third waveguides 101 to 103 is formed in an annular shape in a plan view. The third waveguide 103, which is located at an end portion of the waveguide 100 on a side of the plasma processing space S, is formed to surround the outer periphery of the showerhead electrode 30.

In the film forming apparatus 1, the radio frequency waves from the resonator K are propagated to the first waveguide 101, the second waveguide 102, and the third waveguide 103, and are introduced into the plasma processing space S via the dielectric window 50. Plasma is generated in the plasma processing space S by the introduced radio frequency waves. The wafer W is processed by this plasma. In order to attract ions and the like in the plasma into the wafer W, for example, a power supply for RF bias may be electrically connected to the stage 20 via a matcher. The power supply for RF bias outputs radio frequency power of, for example, 400 kHz to 20 MHz.

The film forming apparatus 1 further includes a controller U. The controller U is configured with, for example, a computer including a CPU, a memory, or the like, and has a program storage (not illustrated). A program is stored in the program storage to control the power supply 91 and the like for performing various processes in the film forming apparatus 1. The program may be recorded in a non-transitory computer-readable storage medium and may be installed in the controller U from the storage medium.

Dielectric Tube 40

Figure 3:
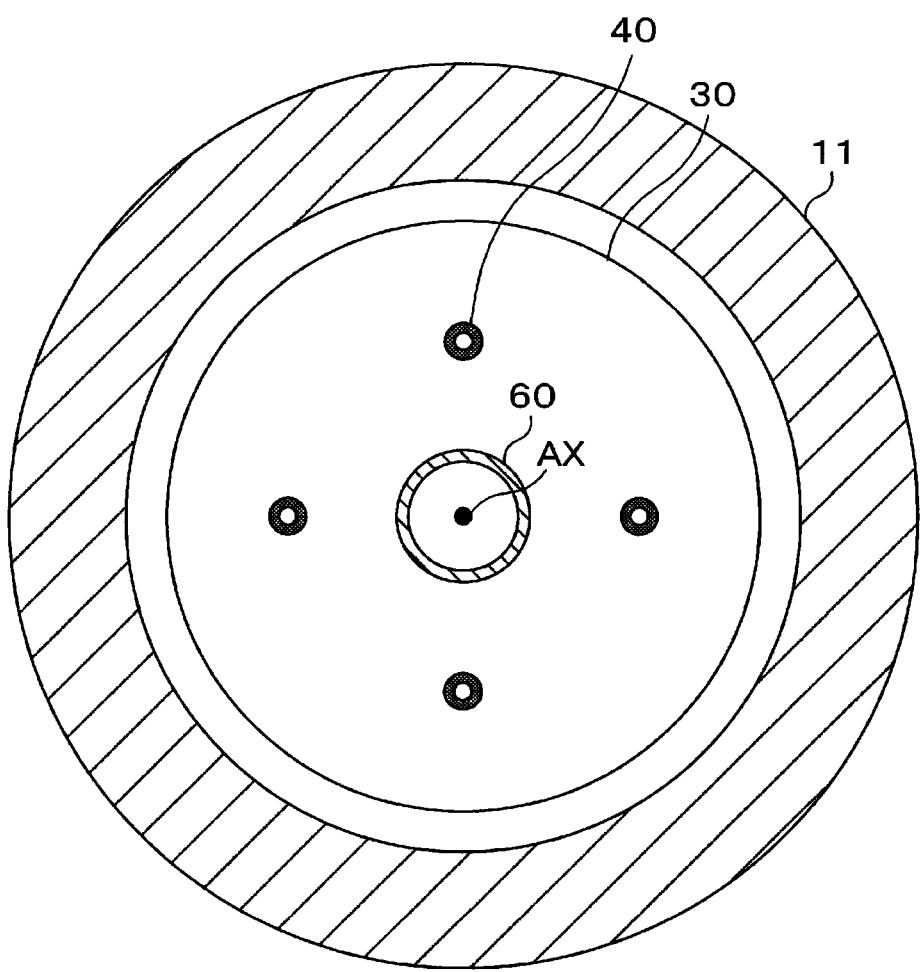
FIG. 3 is a horizontal cross-sectional view of a processing container and illustrates an arrangement form of dielectric tubes.

Subsequently, the dielectric tubes 40 will be described with reference to FIGS. 1 and 2 and by using FIG. 3. FIG. 3 is a horizontal cross-sectional view of the processing container 10 and illustrates an arrangement form of the dielectric tubes 40.

The dielectric tubes 40 are formed of a dielectric material such as alumina in a cylindrical shape. As illustrated in FIGS. 1 and 2, the dielectric tubes 40 are connected to the showerhead electrode 30 so as to penetrate the space between the showerhead electrode 30 and the lid 12. Specifically, the dielectric tubes 40 are connected to the showerhead electrode 30 so as to penetrate the second waveguide 102 defined by the top surface of the showerhead electrode 30 and the bottom surface of the lid 12 in a direction orthogonal to a propagation direction of the radio frequency waves. More specifically, each of the dielectric tubes 40 extends so as to vertically penetrate the second waveguide 102, which is defined by the top surface of the showerhead electrode 30 and the bottom surface of the lid 12 and extends in the horizontal direction, and has one end connected to the top surface of the showerhead electrode 30 and the other end connected to the bottom surface of the lid 12. Each of the dielectric tubes 40 allows fluid communication between one of the gas introduction paths 33 of the showerhead electrode 30 and a corresponding one of the gas flow paths 12b of the lid 12.

In the film forming apparatus 1, since a plurality of sets of gas introduction paths 33 of the showerhead electrode 30 and gas flow paths 12b of the lid 12 is scatteredly provided, as illustrated in FIG. 3, a plurality of (e.g., four in the example of the figure) dielectric tubes 40 is also scatteredly provided to allow fluid communication between the gas introduction paths 33 and the gas flow paths 12b. Specifically, the dielectric tubes 40 are provided at equal intervals on the same circumference centered on the central axis AX of the processing container 10 (that is, a central axis of the coaxial tube forming the first waveguide 101) in a plan view. The number of dielectric tubes 40 is, for example, four to eight. An inner diameter of the dielectric tubes 40 is, for example, 0.6 mm to 10 mm, and an outer diameter of the dielectric tubes 40 is, for example, 5 mm to 20 mm.

When the plurality of dielectric tubes 40 is scattered as described above (specifically, when the dielectric tubes 40 are provided at equal intervals on the same circumference), the processing gas can be uniformly supplied to the plasma processing space S via the showerhead electrode 30. Even when the dielectric tube disclosed in Patent Document 1 is used, the processing gas can be uniformly supplied to the plasma processing space S by enlarging the dielectric tube. However, by providing the plurality of the dielectric tubes 40 to be scattered as in the present embodiment, it is possible to reduce a volume occupied by the dielectric tubes in the radio frequency waveguide. Therefore, according to the present embodiment, it is possible to suppress the loss of electric power due to the dielectric tubes 40.

Since each of the dielectric tubes 40 has a smaller volume than each of the members (specifically, the tubular bodies) forming the dielectric tube disclosed in Patent Document 1, a temperature is unlikely to become non-uniform when the temperature is raised by absorbing the radio frequency waves. Therefore, it is possible to suppress a risk of damage due to thermal shock.

When the plurality of dielectric tubes 40 is scattered as in the present embodiment, it is possible to reduce an area of an inner peripheral surfaces of the dielectric tubes that form gas passages, that is, a contact area between a gas flowing through the dielectric tubes and the inner peripheral surfaces of the dielectric tubes, compared with the case in which the dielectric tube (a large tubular body) disclosed in Patent Document 1 is used. In addition, in a case of supplying the same amount of processing gas to the showerhead electrode 30, by providing the plurality of dielectric tubes 40 scatteredly, it is possible to shorten a time for which the processing gas stays within the dielectric tubes, compared with the case of using the dielectric tube disclosed in Patent Document 1. Therefore, according to the present embodiment, it is possible to prevent the processing gas from being unnecessarily thermally decomposed by the dielectric tubes having a temperature raised by absorbing the radio frequency waves.

As described above, according to the present embodiment, since the plurality of cylindrical dielectric tubes 40 is scatteredly provided, it is possible to suppress the loss of electric power due to the dielectric tubes 40 and further to suppress the risk of damage of the dielectric tube 40 due to thermal shock. In addition, according to the present embodiment, since the plurality of cylindrical dielectric tubes 40 is scatteredly provided, it is possible to prevent the processing gas from being unnecessarily thermally decomposed when passing through the dielectric tubes 40.

Effect of Protrusion 73

In the present embodiment, as described above, the cover conductor 70 forming the first waveguide 101 is provided with the protrusion 73 protruding inward from the inner peripheral surface of the cover conductor 70. The protrusion 73 promotes formation of an annular equipotential plane centered on the central axis of the coaxial tube (specifically, the central axis AX) in the first waveguide 101, that is, in the coaxial tube including the cover conductor 70 and the like. Therefore, even when the radio frequency waves introduced into the first waveguide 101 are not uniform in a circumferential direction centered on the central axis AX, the radio frequency waves propagated from the first waveguide 101 to the second waveguide 102 can be made uniform in the circumferential direction. Therefore, the radio frequency waves introduced into the plasma processing space S and an electric field formed in the plasma processing space S by the radio frequency waves also become uniform in the circumferential direction. Thus, it is possible to perform a more in-plane uniform plasma processing on the wafer W.

As the protrusion 73 is located closer to the second waveguide 102, it is possible to make the radio frequency waves introduced from the first waveguide 101 to the second waveguide 102 more uniform in the circumferential direction.

The present inventors have confirmed through simulations that a distribution of electric field formed in the plasma processing space S becomes axisymmetric by providing the protrusion 73, compared with a case where the protrusion 73 is not provided. In addition, the present inventors have confirmed through simulations that a reflection coefficient F of electric power is improved by providing the protrusion 73, compared with the case where the protrusion 73 is not provided.

Simulation Regarding Protrusion 73

Figure 4:
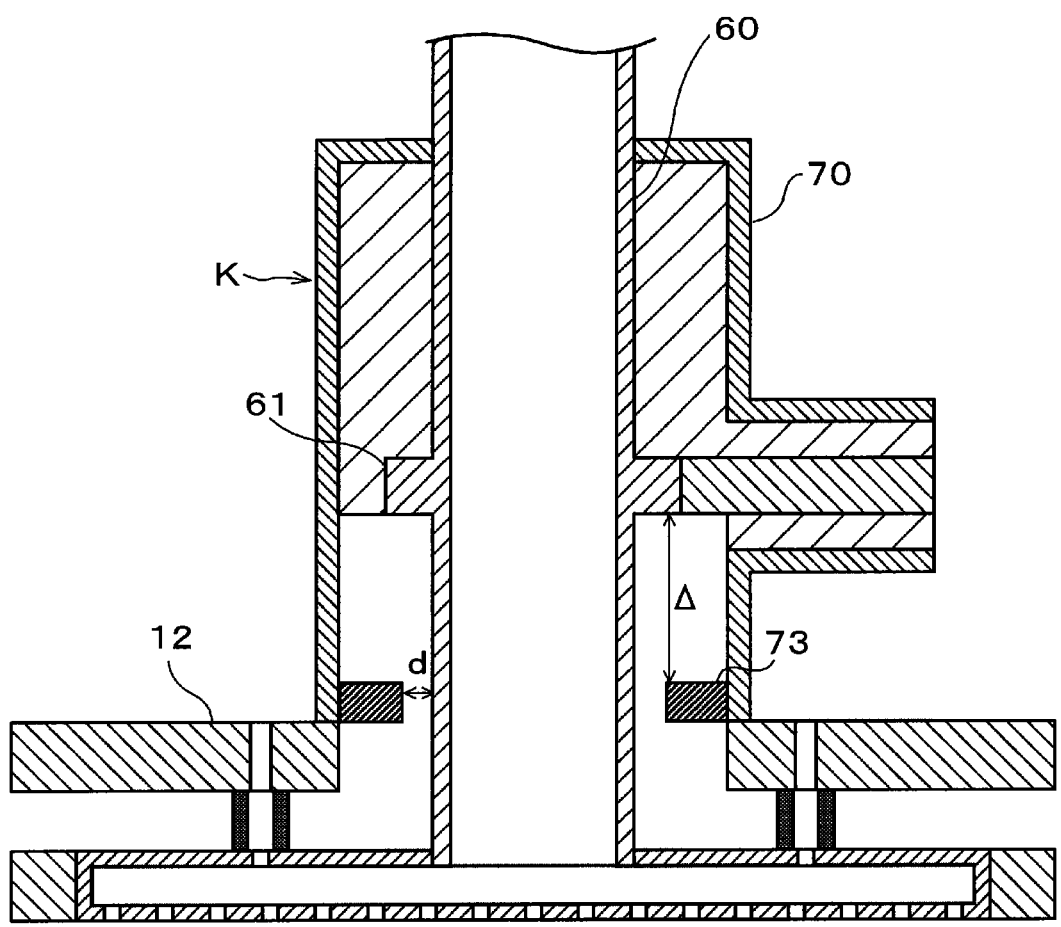
FIG. 4 is a cross-sectional view partially illustrating the film forming apparatus to describe simulation conditions.
Figure 5:
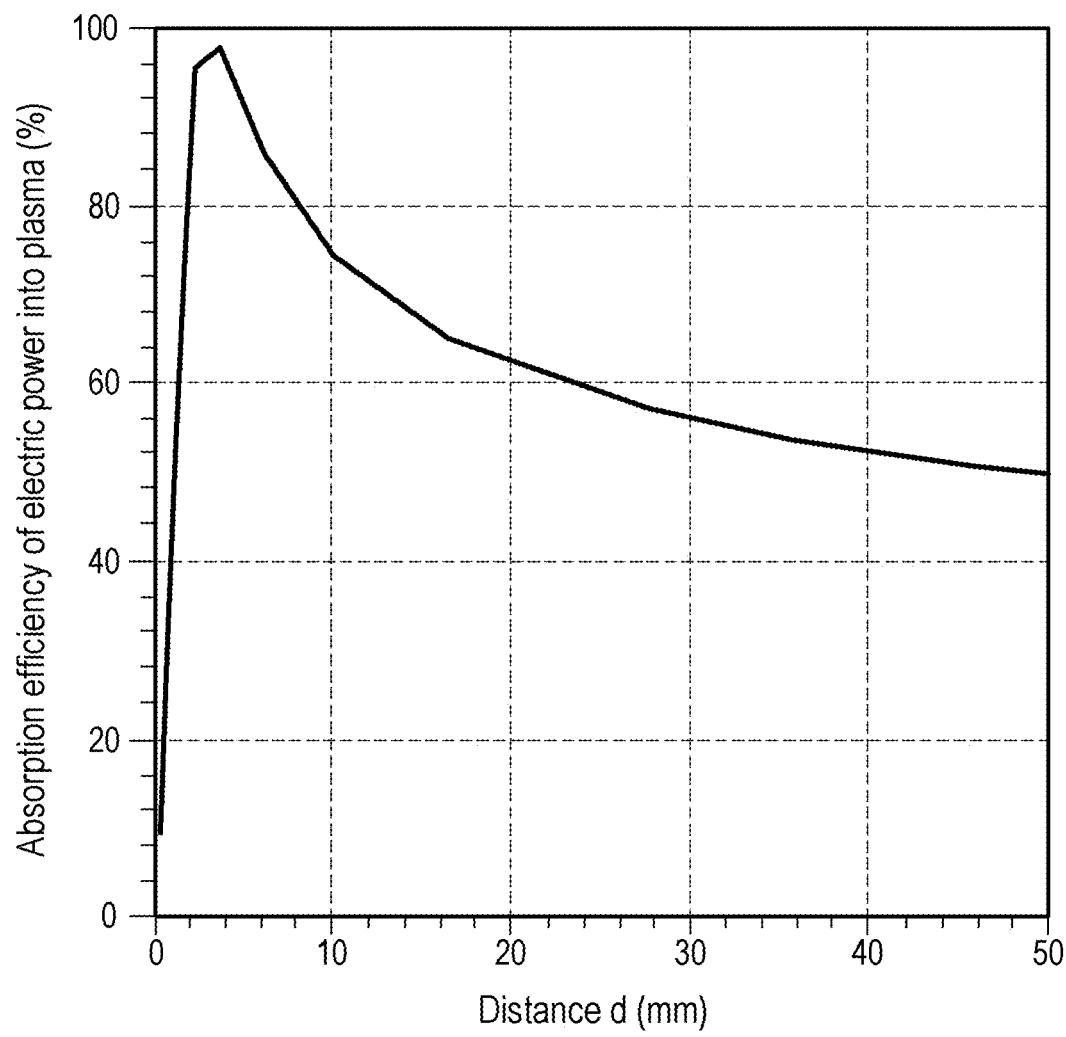
FIG. 5 is a diagram showing a simulation result regarding a relationship between a distance between a gas supply pipe and a protrusion and absorption efficiency of electric power into plasma generated in the processing container.
Figure 6:
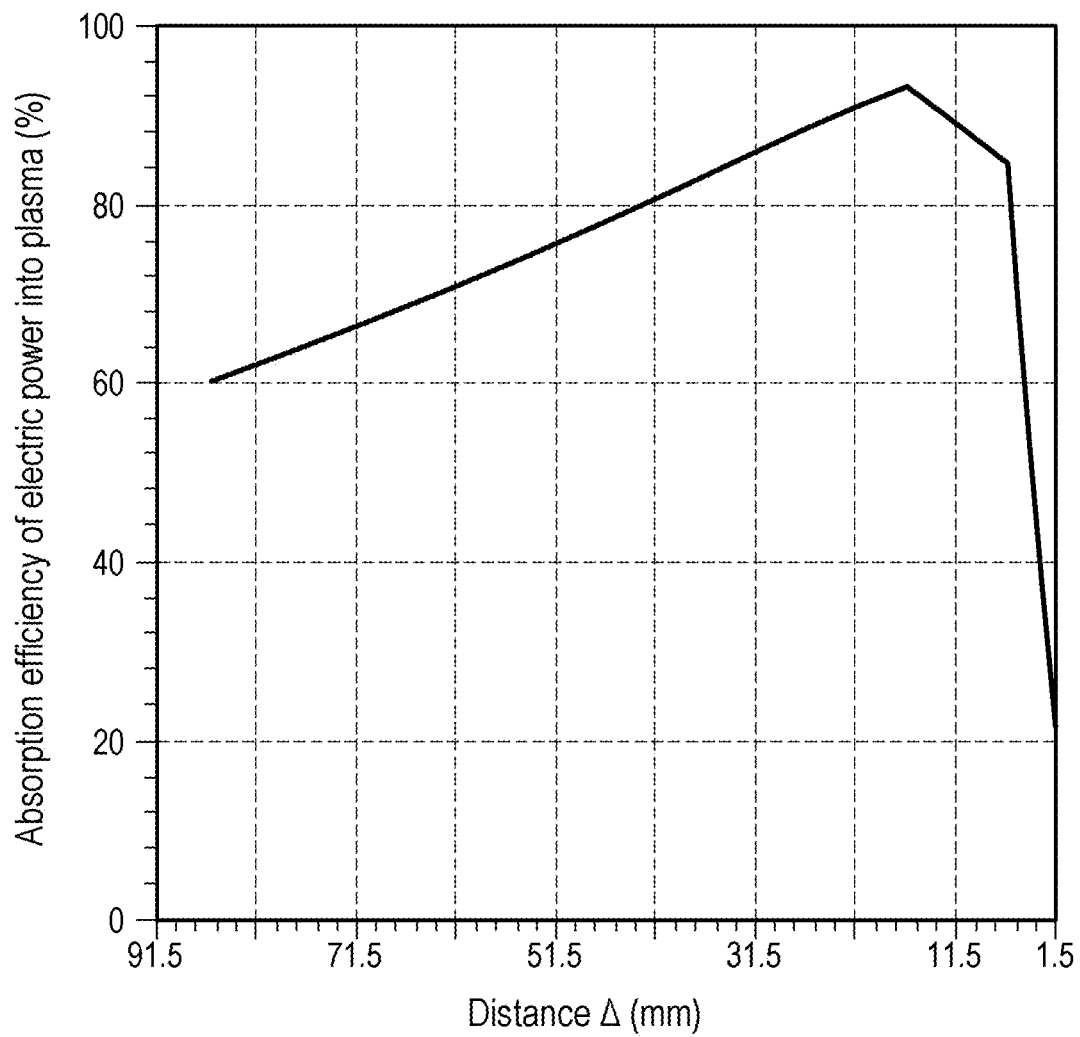
FIG. 6 is a diagram showing a simulation result regarding a relationship between a distance between a protrusion and a resonator and absorption efficiency of electric power into plasma generated in the processing container.

Subsequently, regarding conditions of the protrusion 3, results of simulations performed by the present inventors will be described. FIG. 4 is a cross-sectional view partially illustrating the film forming apparatus 1 to describe simulation conditions. FIG. 5 shows a simulation result regarding a relationship between a distance d between the gas supply pipe 60 and the protrusion 73 (specifically, a distance between the outer peripheral surface of the gas supply pipe 60 and the inner peripheral surface of the protrusion 73) and absorption efficiency of electric power into plasma generated in the processing container 10. FIG. 6 shows a simulation result regarding a relationship between a distance Δ between the protrusion 73 and the resonator K (specifically, a distance between a top surface of the protrusion 73 and the bottom surface of the flange 61) and the adsorption efficiency of electric power into the plasma.

Basic conditions of the performed simulations were as follows.

Diameter of the wafer W: 300 mm
Diameter of the showerhead electrode 30: 390 mm
Pressure in the plasma processing space S: 100 Torr
Inner diameter of the container main body 11: 430 mm
Outer diameter of the dielectric tubes 40: 266 mm
Inner diameter of the dielectric tubes 40: 234 mm
Number of the dielectric tubes 40: four
Interval of the dielectric tubes 40: Equal interval
Material of the dielectric tubes 40: Alumina
Distance from the central axis AX to a center of each dielectric tube 40: 125 mm
Diameter of the portion of the gas supply pipe 60 other than the flange 61: 50 mm
Inner diameter of the cover conductor 70: 90 mm
Distance between a bottom surface of protrusion 73 and the top surface of lid 12: 2 mm
Frequency of the electric power supplied to the power feeding rod 80: 220 MHz In any of the simulations, the entire second waveguide 102 was filled with quartz, except for the portion where the dielectric tubes 40 were disposed.

In the simulation of which result is shown in FIG. 5, the following condition was adopted.

Distance Δ between the protrusion 73 and the resonator K (see FIG. 4): 70 mm

In the simulation of which result is shown in FIG. 6, the following condition was adopted.

Distance d between the gas supply pipe 60 and the protrusion 73 (see FIG. 4): 15 mm In the case of supplying electric power of 220 MHz, as shown in FIG. 5, when the distance d (mm) between the gas supply pipe 60 and the protrusion 73 satisfies Equation (4) described below, the adsorption efficiency of electric power into the plasma generated in the processing container 10 becomes 60% or more.

$$2 \leq d \leq 24 \qquad \text{Equation (4)}$$

When the distance d is less than 2 mm, it becomes difficult for the radio frequency waves to pass through a space between the gas supply pipe 60 and the protrusion 73, which increases a risk of discharge. From this point of view, when the electric power of 220 MHz is supplied, the distance d between the gas supply pipe 60 and the protrusion 73 may be 2 mm or more.

In the case of supplying electric power of 220 MHz, as shown in FIG. 6, when the distance Δ (mm) between the protrusion 73 and the resonator K satisfies Equation (5) described below, the adsorption efficiency of electric power into the plasma generated in the processing container 10 becomes 60% or more.

$$4 \leq \Delta \leq 85 \quad \text{Equation (5)}$$

When the distance Δ is less than 4 mm, resonance in the resonator K is hindered. From this point of view, when the power of 220 MHz is supplied, the distance Δ between the protrusion 73 and the resonator K may be 4 mm or more.

When the Equations (4) and (5) described above are converted into general equations that do not depend on a frequency f of the electric power supplied to the power feeding rod 80, that is, the frequency f of the radio frequency waves, Equations (4a) and (5a) described below are obtained.

$$2*(220\times10^6)/f \leq d \leq 24*(220\times10^6)/f \quad \text{Equation (4a)}$$

$$4*(220\times10^6)/f \leq \Delta \leq 85*(220\times10^6)/f \quad \text{Equation (5a)}$$

Modification

Figure 7:
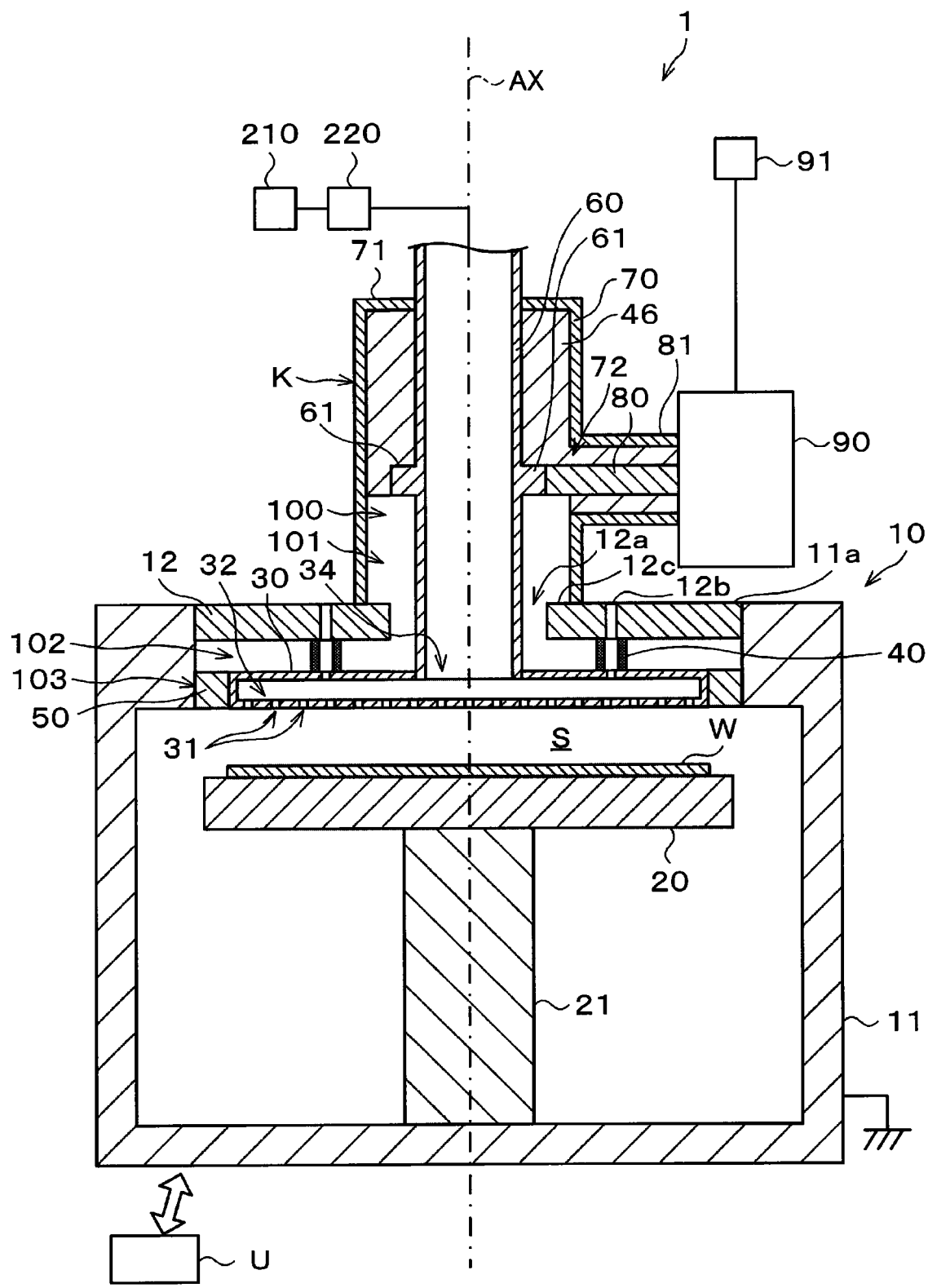
FIG. 7 is a view illustrating another example of the protrusion.

In the above example, the protrusion 73 is provided to protrude inward from the inner peripheral surface of the cover conductor 70, but examples of the protrusion 73 are not limited thereto. FIG. 7 is a diagram illustrating another example of the protrusion. As illustrated in FIG. 7, the diameter of the through-hole 12a in the lid 12 may be made smaller than the inner diameter of the cover conductor 70, and a portion 12c of the lid 12 located inward of the inner peripheral surface of the cover conductor 70 may be used as the protrusion.

In the foregoing, the film forming apparatus has been described as an example, but the technique according to the present disclosure is also applicable to a plasma processing apparatus performing a process other than the film forming process. For example, the technique according to the present disclosure is also applicable to a plasma processing apparatus that performs an etching process or a doping process as the plasma processing.

According to the present disclosure, in a plasma processing apparatus that performs a plasma processing by using plasma generated based on radio frequency waves, when a dielectric tube for supplying a gas to an electrode is provided to penetrate a radio frequency waveguide, it is possible to suppress a loss of electric power due to the dielectric tube.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus comprising:
   a coaxial tube that extends in a vertical direction and forms a portion of a radio frequency waveguide;
   a substrate support configured to support a substrate;
   an electrode including a gas flow path connected to a gas ejection port opened toward a space above the substrate support, wherein the electrode is provided above the substrate support and an inner conductor of the coaxial tube is connected to a center of the electrode;
   a lid forming an enlarged diameter portion forming a part of the radio frequency waveguide together with the electrode, wherein the lid is connected to an outer conductor of the coaxial tube, the lid being vertically spaced apart from the electrode; and
   dielectric tubes formed of a dielectric material being disposed between the electrode and the lid, wherein each of the dielectric tubes penetrates a space between the electrode and the lid to supply a gas to the electrode, wherein the dielectric tubes is scatteredly provided, and wherein a lower end of each of the dielectric tubes is connected to a gas introduction path of the electrode on an upper surface of the electrode, and an upper end of each of the dielectric tubes is connected to a gas flow path of the lid on a lower surface of the lid.

2. The plasma processing apparatus of claim 1, wherein each of the dielectric tubes is connected to a top surface of the electrode and provided on a same circumference centered on a central axis of the coaxial tube in a plan view.

3. The plasma processing apparatus of claim 2, further comprising a protrusion having an annular shape in a plan view and protruding inward from the outer conductor of the coaxial tube.

4. The plasma processing apparatus of claim 3, further comprising a resonator connected to the coaxial tube at a side opposite to the lid, wherein radio frequency waves are introduced into the resonator from a lateral side.

5. The plasma processing apparatus of claim 4, wherein a distance Δ (unit: millimeters) between the protrusion and the resonator satisfies:

$$4*(220\times10^6)/f \leq \Delta \leq 85*(220\times10^6)/f,$$

where f is a frequency in Hz of the radio frequency waves.

6. The plasma processing apparatus of claim 5, wherein a distance d (unit: millimeters) between the inner conductor of the coaxial tube and the protrusion satisfies:

$$2*(220\times10^6)/f \leq d \leq 24*(220\times10^6)/f,$$

where f is a frequency in Hz of the radio frequency waves.

7. The plasma processing apparatus of claim 6, wherein the inner conductor of the coaxial tube is a gas supply pipe configured to supply a plasmarized gas to the electrode.

8. The plasma processing apparatus of claim 4, wherein a distance d (unit: millimeters) between the inner conductor of the coaxial tube and the protrusion satisfies:

$$2*(220\times10^6)/f \leq d \leq 24*(220\times10^6)/f,$$

where f is a frequency in Hz of the radio frequency waves.

9. The plasma processing apparatus of claim 1, further comprising a protrusion having an annular shape in a plan view and protruding inward from the outer conductor of the coaxial tube.

10. The plasma processing apparatus of claim 1, wherein the inner conductor of the coaxial tube is a gas supply pipe configured to supply a plasmarized gas to the electrode.

* * * * *